(12) United States Patent
Johnson

(10) Patent No.: US 6,301,000 B1
(45) Date of Patent: Oct. 9, 2001

(54) DUAL-FLEXURE LIGHT VALVE

(76) Inventor: Kenneth Carlisle Johnson, 2502 Robertson Rd., Santa Clara, CA (US) 95051

( * ) Notice: Subject to any disclaimer, the term of this patent is extended or adjusted under 35 U.S.C. 154(b) by 0 days.

(21) Appl. No.: 09/480,426

(22) Filed: Jan. 11, 2000

Related U.S. Application Data

(63) Continuation of application No. 09/286,888, filed on Apr. 9, 1999, now Pat. No. 6,177,980.
(60) Provisional application No. 60/115,450, filed on Jan. 11, 1999.

(51) Int. Cl.[7] .......................... G03B 27/54; G03B 13/24; G02B 26/00; G02B 5/18
(52) U.S. Cl. .............................. 355/67; 355/44; 359/291; 359/572
(58) Field of Search .................................. 355/67–68, 71, 355/53, 44–45; 359/290–291, 572

(56) References Cited

U.S. PATENT DOCUMENTS

| | | | |
|---|---|---|---|
| 4,441,791 | 4/1984 | Hornbeck | 350/360 |
| 5,296,891 | * 3/1994 | Vogt et al. | 355/67 |
| 5,493,439 | 2/1996 | Engle | 359/292 |
| 5,841,579 | 11/1998 | Bloom et al. | 359/572 |
| 5,949,503 | * 9/1999 | Koyama et al. | 349/41 |
| 5,953,153 | * 9/1999 | Conner et al. | 359/298 |
| 6,130,770 | * 10/2000 | Bloom | 359/224 |

OTHER PUBLICATIONS

Choksi et al., "Maskless extreme ultraviolet lithography," *J. Vac. Sci. Technol.* B 17(6), Nov./Dec. 1999, pp. 3047–3051.
Folta, J.A. et al., "High density arrays of micromirrors," Feb. 1999, pp. 1–9 (UCRL–ID–133164/*National Technical Information Service*, US Dept. of Commerce, Springfield, VA 22161).

* cited by examiner

*Primary Examiner*—Russell Adams
*Assistant Examiner*—Hung Henry Nguyen
(74) *Attorney, Agent, or Firm*—Townsend and Townsend and Crew LLP

(57) ABSTRACT

A spatial light modulator pixel includes a flexible reflective surface that is electrostatically actuated to control the surface shape and thereby phase-modulate reflected light. The reflected light is filtered by a projection aperture, wherein the phase modulation controls the amount of light from the pixel that is filtered through the aperture. The spatial light modulator includes and array of such pixels, which are imaged onto a conjugate image plane, and each pixel controls the image brightness at a corresponding conjugate image point. High image contrast is achieved by using a dual-flexure pixel design in which two flexure elements operate conjunctively to maintain well-defined diffraction nodes at or near the projection aperture edges over the full modulation range.

5 Claims, 4 Drawing Sheets

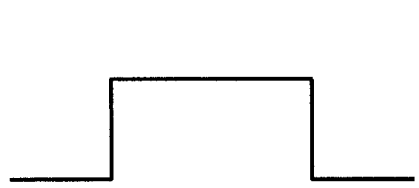
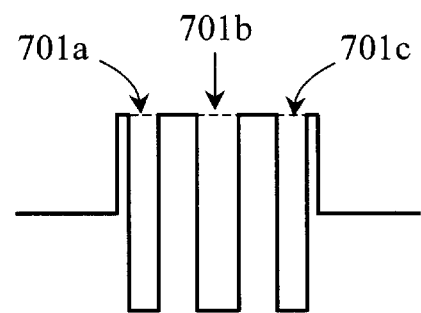
Fig 7A            Fig 7B
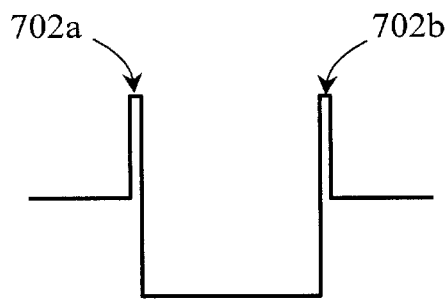
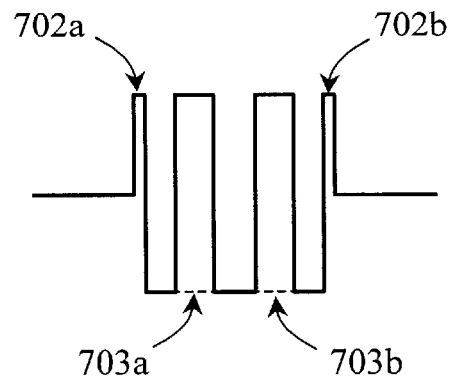
Fig 8A            Fig 8B

DUAL-FLEXURE LIGHT VALVE

CROSS-REFERENCES TO RELATED APPLICATIONS

This application claims priority from provisional application No. 60/115,450 (filed Jan. 11, 1999) which is a continuation of application 09/286,888 (filed Apr. 9, 1999) now U.S. Pat. No. 6,177,980, the disclosures of which are incorporated by reference.

BACKGROUND OF THE INVENTION

Micromechanically-actuated reflectors are used as optical phase-shifting elements in several types of spatial light modulators, which function as image generators for applications such as image displays, printing, and maskless lithography. For example, the "Deformable Mirror Light Modulator" described in U.S. Pat. No. 4,441,791, and the "Enhanced Surface Deformation Light Modulator", U.S. Pat. No. 5,493,439, employ deformable membrane mirrors as light-modulating elements. Another prior-art device in this category, the "Flat Diffraction Grating Light Valve", U.S. Pat. No. 5,841,579, uses interdigitated groups of alternately fixed and movable ribbon reflectors to form a dynamically variable diffraction grating. Advantages of the grating light valve are that it can operate under high illumination levels and at very high (e.g., megahertz-level) switching rates, and it can be used with broadband illumination. This type of modulator is especially well adapted for display applications, but membrane-type modulators could have advantages for applications that require small pixels and very accurate control of the mirror deflection. For example, DUV lithography (at a 193 nm wavelength) would require maximum deflection amplitudes of approximately 50 to 75 nm, and at EUV wavelengths (e.g., 13 nm) the deflection amplitude would be only 3 to 5 nm. Modem film deposition technology can form membranes such as nitride film membranes with atomic-scale thickness control, making it possible to achieve very precisely-controlled membrane deflection characteristics for DUV or possibly EUV operation. Also, a membrane modulator pixel can be formed as a single, continuous reflector surface, in contrast to the grating light valve, which typically comprises six ribbon reflectors per pixel.

SUMMARY OF THE INVENTION

This invention is an improved light-modulating pixel device, termed a "dual-flexure light valve" (DFLV), which comprises a flexible reflective surface that is electrostatically actuated to alter its shape and thereby phase-modulate reflected light. (In this context the term "light" connotes electromagnetic radiation, which could include DUV or EUV radiation.) An array of such pixels forms a spatial light modulator which functions in conjunction with an imaging system that images the array onto a conjugate image plane. (A printing surface might, for example, be disposed in the image plane.) When the pixel surface is flat, reflected light is efficiently transmitted to a conjugate image point on the image plane. When it is flexed, the pixel acts as a diffracting element, causing the reflected light to be angularly dispersed. A projection aperture in the imaging system filters out the diffracted light; thus a pixel's conjugate image point will appear dark when the pixel is in its flexed state. The pixels could operate as binary-state (ON/OFF) modulators, or they could alternatively operate over a range of deflection levels to provide grayscale intensity control at each conjugate image point.

Each pixel comprises two adjacent flexure regions which operate conjunctively to phase-modulate reflected radiation. An advantage of this dual-flexure design is that the design geometry can be configured so that the diffraction-limited electromagnetic field amplitude over the projection aperture has substantially zero-amplitude nodes at or near the aperture edges, and the edge amplitude remains substantially zero over the full flexure modulation range. (If only a single flexure was used the field amplitude at the aperture edges would tend to increase as the amplitude at the center of the aperture decreases, and the achievable image contrast would be very poor.)

BRIEF DESCRIPTION OF THE DRAWINGS

FIGS. 7A,B are cross-sectional reflected amplitude profiles across a grating light valve, illustrating a high-contrast, three-actuator design.

FIGS. 8A,B are cross-sectional reflected amplitude profiles across a grating light valve, illustrating a high-contrast, two-actuator design with edge phase shifters.

DESCRIPTION OF THE SPECIFIC EMBODIMENTS

Figure 1A:
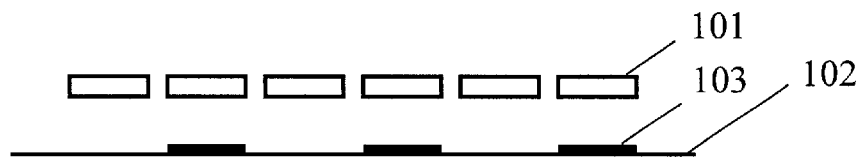
FIGS. 1A,B are cross-sectional views of a prior-art light modulator (the grating light valve).
Figure 1B:

FIGS. 1A,B illustrate a prior-art light modulator, the grating light valve (U.S. Pat. No. 5,841,579), which comprises an array of parallel, reflective ribbon elements. The ribbons (such as ribbon 101, shown cross-sectionally) are anchored at their ends and are suspended over a substrate 102. Alternate ribbons are movable and can be drawn toward the substrate by means of electrostatic interaction with a conductor film or films, such as conductor 103 (FIG. 1B). Typically, a modulator pixel element comprises six ribbons, three of which are movable. When the ribbons are in the up position (FIG. 1A) their reflective surfaces are all coplanar and operate in conjunction as a miniature plane mirror. When alternate ribbons are in the down position (FIG. 1B) the pixel functions as a diffraction grating that diverts reflected illumination into several diffracted orders.

Figure 2A:
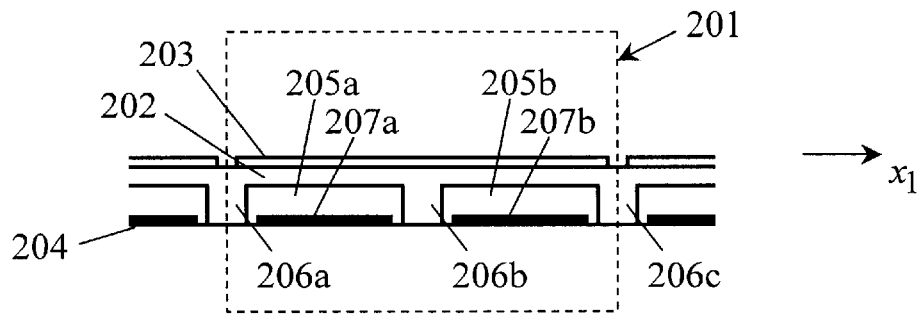
FIGS. 2A,B are cross-sectional views of a DFLV pixel.
Figure 2B:
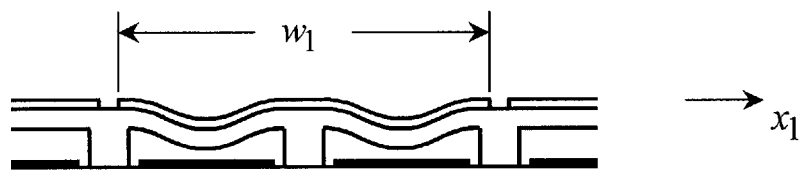
Figure 3:
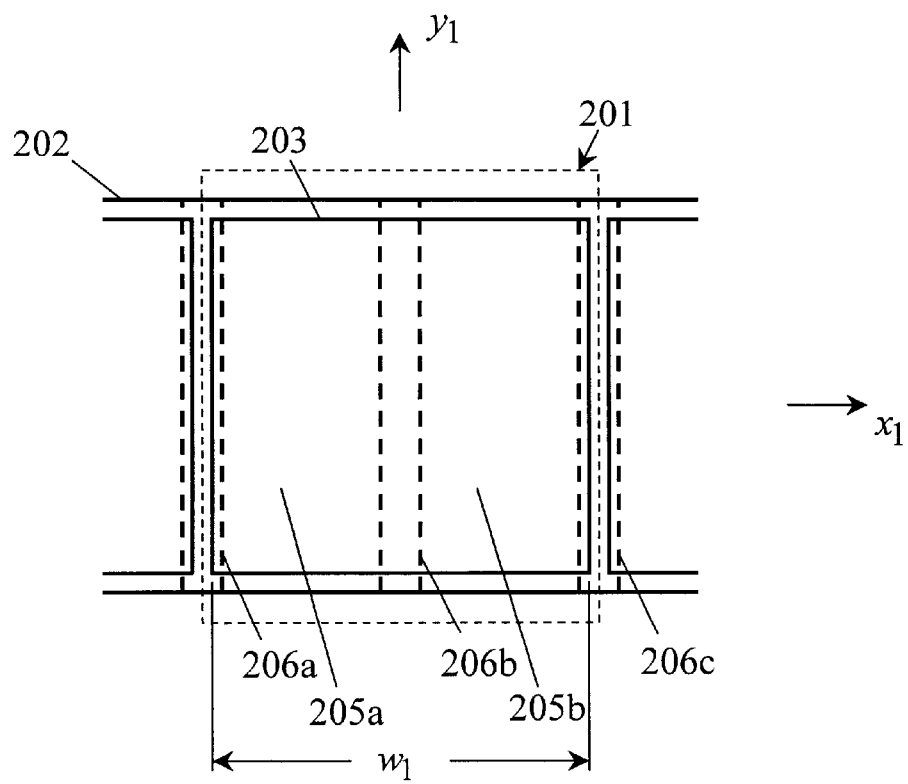
FIG. 3 is a plan view of a DFLV pixel.

A DFLV pixel, illustrated cross-sectionally in FIGS. 2A,B and in a plan view in FIG. 3, functions in a manner similar to the grating light valve, but it has a very different structure. The pixel 201 comprises a continuous thin, flexible film 202 (such as an aluminum or nitride layer) which can be common to all pixels in an array, and which is reflective or is coated with a reflective film 203. The flexure layer is supported over a substrate 204, and the space between the layer and the substrate is divided into empty cells 205*a*, 205*b*, etc. by means of cell walls (or posts) 206*a*, 206*b*, 206*c*, etc. that support the flexure layer. Each pixel comprises two adjacent cells, and adjacent pixels may share cell walls. The portions of the flexure layer over each cell can be drawn toward the substrate by means of electrostatic interaction with a conductive film or films on the substrate, such as conductors 207*a* and 207*b* (FIG. 2B). (Alternatively, the layer could be flexed upward by means of repulsive, rather than attractive, electrostatic force.)

Like the grating light valve, a DFLV pixel functions as a specular mirror when the flexure layer is flat, and as a diffraction grating when it is deformed. But the DFLV forms a continuous-profile grating (in contrast to the discontinuous, lamellar grating profile formed by the grating light valve), and its reflective surface need not be partitioned into separate, lithographically-isolated reflector elements. (The reflective surface would not necessarily even need to be partitioned between pixels.) Also, the DFLV pixel comprises just two grating periods (whereas the grating light valve typically comprises three).

Figure 4:
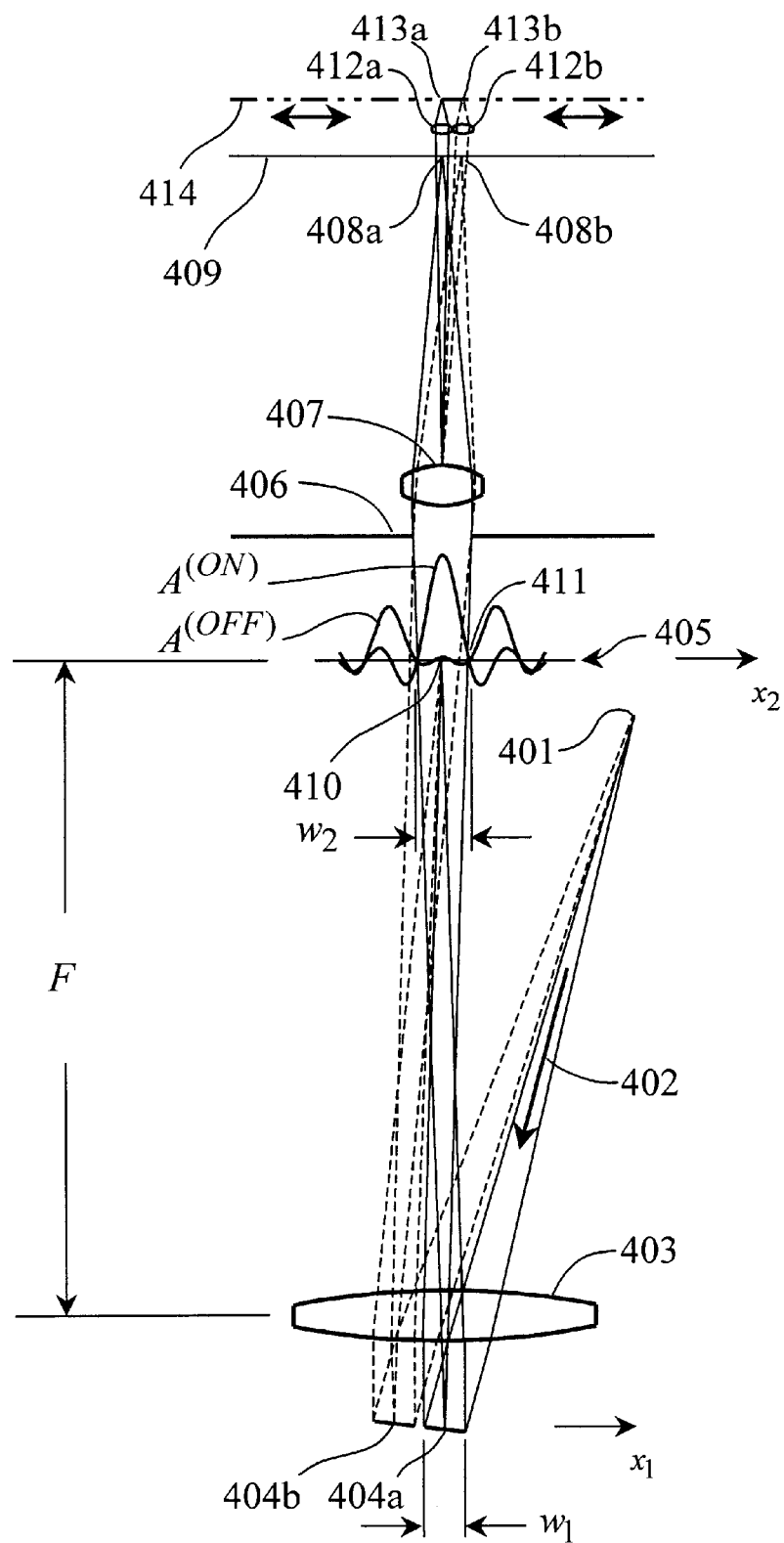
FIG. 4 schematically illustrates the DFLV's principle of operation.

FIG. 4 schematically illustrates the DFLV's principle of operation. A point light source 401 produces illumination 402, which is collimated by a collimator lens 403 and illuminates a DFLV pixel 404a. The illumination is reflected by the pixel, passes back through lens 403 and is focused onto a focal plane 405. (The focal plane is conjugate to source point 401.) A projection aperture 406 proximate to the focal plane filters the focused beam, and an imaging lens 407 images pixel 404a onto a conjugate point 408a on an image plane 409. (A printing or display surface may be disposed in plane 409.)

When the pixel is in its ON (non-diffracting) state, the illumination radiation on plane 405 has a diffraction-limited amplitude distribution, illustrated as $A^{(ON)}$ in FIG. 4, which has a peak centered at the position of the source's geometric image 410. In its OFF (diffracting) state the pixel diverts radiation away from the geometric image point, and the diffracted amplitude has the form illustrated as $A^{(OFF)}$. Thus, when the pixel is ON a substantial portion of the reflected radiation is filtered through aperture 406 and illuminates image point 408a, whereas in its OFF state the pixel diverts radiation out of the aperture and the image point is dark. Similarly, adjacent pixel 404b modulates the image intensity at point 408b, and a spatial light modulator comprising a full array of such pixels creates a digitally synthesized, dynamically modulated image across image plane 409.

FIG. 4 represents just one of a variety of optical configurations that could be used with the DFLV. For example, the above-noted patent application Ser. No. 09/286,888, "High-Throughput, Maskless Lithography System" discloses a high-resolution printing system in which off-axis portions of a collimating mirror perform the functions of lenses 403 and 407 in FIG. 4. The spatial light modulator in the disclosed embodiment is a grating light valve, but a DFLV would function equally well.

A printing surface could be disposed in or near the image plane 409, but the printing resolution would be limited by the numerical aperture of lens 407. The '888 invention circumvents this limitation by using a microlens array proximate to image plane 409 to condense the radiation from each pixel 404a, 404b, etc., onto a corresponding highly resolved focal point on a printing surface. For example, FIG. 4 illustrates a microlens 412a that condenses radiation from pixel 404a onto a focal point 413a on a printing surface 414, and an adjacent microlens 412b similarly condenses radiation from pixel 404b onto point 413b. The surface is raster-scanned as the focal point intensities are modulated so that a very high-resolution exposure image is formed on the printing surface.

For any particular wavelength $\lambda$, a DFLV pixel has the effect of applying a complex amplitude scale factor $A_1[x_1, y_1]$ to the incident radiation's amplitude distribution, wherein $x_1$ and $y_1$ are position coordinates on the pixel (FIGS. 2A,B;3) and $$A_1[x_1, y_1] = r[x_1, y_1]\exp[-i4\pi h[x_1, y_1]/\lambda] \quad \text{Eq 1}$$

wherein $r[x_1, y_1]$ is the mirror reflectance amplitude distribution across the pixel aperture (which is typically constant within the reflector region and zero outside), and $h[x_1, y_1]$ is the mirror height distribution relative to the ON-state surface height. (An implicit time-separable factor of $\exp[+i2\pi ct/\lambda]$ is assumed, wherein t is time and c is the speed of light; and h is downward-positive in FIGS. 2A,B.) Assuming a unit-amplitude incident beam, $A_1[x_1, y_1]$ represents the reflected beam's amplitude distribution across the pixel aperture. (Actually, if the beam is obliquely incident as illustrated in FIG. 4 it will have a phase gradient across the pixel aperture, but Eq 1 will still represent the reflected beam amplitude across a plane parallel to the reflected wavefronts.) The reflected radiation has a corresponding amplitude distribution $A_2[x_2, y_2]$ on source focal plane 405 (FIG. 4). For any specific wavelength $\lambda$, the $A_2$ distribution has a Fourier transform relationship to the $A_1$ distribution. Neglecting an unimportant constant scale factor, this relationship has the form $$A_2[x_2, y_2] = \frac{1}{\lambda F}\int\int A_1[x_1, x_2]\exp\left[i2\pi\frac{x_1 x_2 + y_1 y_2}{\lambda F}\right]dx_1 dy_1 \quad \text{Eq 2}$$

wherein $x_2$ and $y_2$ are position coordinates on plane 405, F is the focal length of lens 403 (or of an equivalent substituted focusing element, such as the collimating mirror in the '888 application), and the integral is taken over the pixel 201 in FIG. 3. (Eq 2 is equivalent to Eq 4 in the '888 application.) The $A^{(ON)}$ amplitude profile in FIG. 4 corresponds to the $A_2$ distribution for the case when $h[x_1, y_1]$ is identically zero across the entire pixel aperture (i.e., when the pixel is in its ON state, with its surface flat). The $A^{(OFF)}$ amplitude profile corresponds to the $A_2$ distribution when $h[x_1, y_1]$ represents the pixel in its OFF state, with the surface deformed. (The optimum surface deformation in the OFF state is wavelength-dependent, so the design is optimized for a specific design wavelength. In practice, however, acceptable—though not ideal—performance might be achieved over an extended wavelength range.)

Eq 2 can be used to estimate the image point intensity in the pixel's ON and OFF states, or at intermediate states wherein the movable reflector position is between its nominal ON and OFF positions. (The image point intensity is proportional to the integral of $|A_2[x_2, y_2]|^2$ over the portion of the focal plane 405 area that is delimited by projection aperture 406.) Design parameters such as the deformed surface shapes and the dimensions of the pixel reflectors and aperture 406 can be selected to maximize the contrast ratio, defined as the ratio of the ON- to OFF-state image intensity.

The system optical design can be developed as follows: Denoting the width of the pixel's reflective area as $w_1$, (FIGS. 3, 4), the $A^{(ON)}$ amplitude profile will have diffraction nodes (such as node 411 in FIG. 4) that are separated by a distance $w_2$, wherein $$w_2 = 2\lambda F/w_1 \quad \text{Eq 3}$$

The edges of aperture 406 are preferably located approximately at the first diffraction nodes, so $w_2$ also represents the projection aperture width. The surface height function $h[x_1, y_1]$ is defined an equation of the form $$h[x_1, y_1] = m\lambda \sum_j a_j \cos[4\pi j x_1 / w_1] \qquad \text{Eq 4}$$

wherein j ranges over non-negative integers, the $a_j$'s are "profile coefficients", and m is a "modulation factor" that is adjusted to control the image intensity level. In the pixel's ON state m=0, and in the OFF state m=1. The profile coefficients sum to zero, $$\sum_j a_j = 0 \qquad \text{Eq 5}$$

hence $h[x_1, y_1]$ is zero at $x_1=0$ and at $x_1=\pm w_1/2$, independently of m (cf. FIG. 2B).

However, the $a_0$ coefficient only affects the diffracted field's overall phase and has no effect on its intensity distribution, so for the purpose of optical performance modeling it is convenient to drop the $a_0$ term in Eq 4. If this term is neglected, it follows from Eqs 4, 1, and 2 that $A_2[x_2, y_2]$ is real valued at $x_2=0$, $$Im[A_2[0, y_2]]=0 \text{ (with } a_0=0\text{)} \qquad \text{Eq 6}$$

wherein "Im" denotes the imaginary part of a complex quantity. m can be adjusted to make the real part zero ($Re[A_2[0, y_2]]=0$, wherein "Re" denotes the real part), and the $a_j$ coefficients are scaled so that this condition occurs at m=1. Thus, the field amplitude at the center of the aperture is zero in the OFF state, $$A_2[0, y_2]=0 \text{ at } m=1 \qquad \text{Eq 7}$$

The height profile defined by Eq 4 is periodic modulo-$w_1/2$ in the $x_1$ direction, $$h[x_1 \pm w_1/2, y_1]=h[x_1, y_1] \qquad \text{Eq 8}$$

It follows from this periodic symmetry and Eq 2 that the diffracted field is zero at the aperture edges, independently of m, $$A_2[\pm w_2/2, y_2]=0 \text{ for any } m \qquad \text{Eq 9}$$

Thus the OFF-state aperture field is zero at three $x_1$ positions ($x_1=0$ and $x_1=\pm w_1/2$).

The profile coefficient list $\{a_0, a_1\}=\{0.1914, -0.1914\}$ satisfies Eq 7, and the theoretical contrast ratio with these parameters is 390. This design configuration can be refined to improve the contrast ratio. For example, using three profile coefficients optimized for maximum contrast, the following values are obtained: $\{a_0, a_1, a_2\}=\{0.1868, -0.1924, 0.0056\}$, and the contrast ratio becomes 632. (Eq 7 does not hold with this design, but Eq 9 still holds.) The contrast can be further improved by optimizing the width of the reflector film. For example, if the width is reduced from $w_1$, to $0.9673 w_1$ (wherein $w_1$ is the "nominal" pixel width that defines the projection aperture width $w_2$ according to Eq 3), and if the profile coefficients are set to $\{a_0, a_1, a_2\}=\{0.1859, -0.1938, 0.0079\}$, then a contrast ratio of 1359 is obtained (although neither Eq 7 nor Eq 9 is exactly satisfied with this design).

Figure 5:
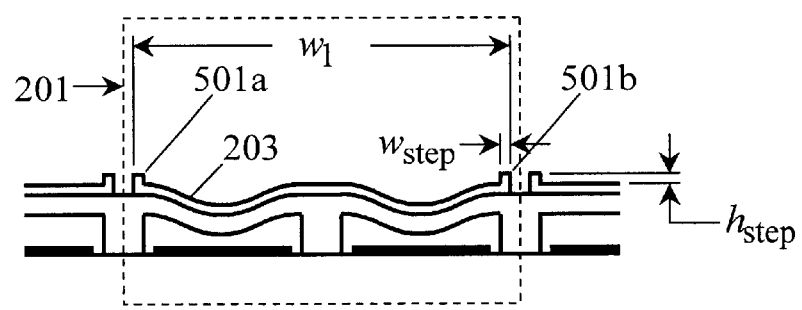
FIG. 5 illustrates a contrast-enhancement mechanism comprising phase shifters bordering a DFLV pixel.

The contrast could be increased even further by forming a narrow reflective step on either side of the pixel, as illustrated in FIG. 5. In this design the reflective region 203 extends across the full width dimension $w_1$, but the reflector is bordered by two narrow steps 501a and 501b, which function as phase shifters. (The phase shifters could alternatively comprise deposited transparent films.) The width and height dimensions of each phase shifter, designated as $w_{step}$ and $h_{step}$, can be optimized along with the profile coefficients to optimize contrast. One such set of optimized parameters is $$w_{step}=0.0231 w_1$$

$$h_{step}=0.1581\lambda$$

$$\{a_0, a_1, a_2\}=\{0.1835, -0.1926, 0.0091\}$$

The theoretical contrast ratio with this design is 3040.

Figure 6A:
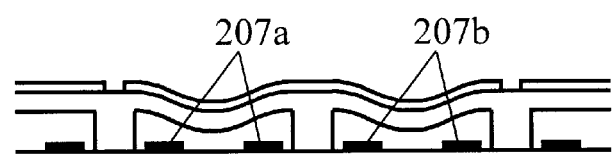
FIGS. 6A,B conceptually illustrate alternative substrate conductor designs that could optimize the electrostatic force distribution across the DFLV flexure surfaces.
Figure 6B:
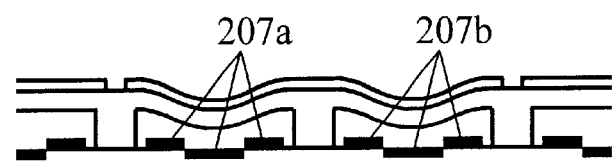

The above design approach assumes that the flexure height profile can be controlled to optimize contrast. The substrate conductor geometry could be designed to achieve an optimum or near-optimum flexure shape. For example, FIG. 6A illustrates a design in which the conductors 207a and 207b are segmented so that the electrostatic force is more optimally distributed. This might also be achieved by using optimally contoured conductors, as illustrated in FIG. 6B.

The edge phase shifter mechanism described above and illustrated in FIG. 5 could also be used with other pixel types. For example, the above-noted application Ser. No. 09/286,888 describes a variant of the grating light valve that uses three ribbon actuators. (See FIG. 6 in the '888 application.) This could be converted to an essentially equivalent two-actuator design with edge phase shifters, as illustrated in FIGS. 7A,B and 8A,B. FIGS. 7A,B are cross-sectional plots of the reflected field amplitude across a grating light valve of the type described in the '888 application with the pixel in its ON state (FIG. 7A) and in its OFF state (FIG. 7B; cf. FIG. 6 in '888). In the OFF state, three ribbons are displaced to sign-invert the field over the respective pixel regions 701a, 701b, and 701c. In the alternative two-actuator design, the pixel is bordered with narrow phase-shifters which sign-invert the field along the pixel edges 702a and 702b, as illustrated in FIG. 8A. This represents the pixel's ON state. In the OFF state two ribbons are actuated to sign-invert the field over regions 703a and 703b, as illustrated in FIG. 8B. The OFF-state field profile illustrated in FIG. 8B is identical to the OFF-state profile of the 3-actuator design (FIG. 7B). A limitation of this design is that the phase shifters reduce the optical efficiency by 20% in the ON state (FIG. 8A), but for many applications this loss would be more than compensated for by the simpler two-actuator design. With either approach, the theoretical contrast ratio (ignoring practical limiting factors such as ribbon gaps) is in excess of 2,000,000.

What is claimed is:

1. A spatial light modulator comprising an array of radiation-modulating pixel elements, wherein
   each pixel comprises a flexible reflective surface supported over a substrate,
   the space between each pixel surface and the substrate is partitioned into two cells by means of cell walls that support the surface along two opposite sides of the pixel and along a center line between the two sides,
   the portion of the surface over each cell forms a flexure element that is electrostatically actuated to control its surface shape,
   illuminating radiation originating from an illumination source reflects off of the pixel array and is focused onto a focal plane conjugate to the source,
   a portion of the reflected radiation is filtered by a projection aperture proximate to the focal plane, and each pixel's flexure elements control the reflected radiation's phase distribution across the pixel, thereby controlling the amount of radiation energy from that pixel that is filtered by the projection aperture.

2. The spatial light modulator of claim 1, wherein each pixel's reflective surface is bordered by phase shifters along two opposite sides of the pixel, wherein the phase shifters are configured to maximize a "contrast ratio" defined as the ratio of the maximum to minimum achievable aperture-filtered energy.

3. The spatial light modulator of claim 1, wherein the filtered radiation from each pixel is focused onto a corresponding image point on an image plane conjugate to the spatial light modulator, the projection aperture is disposed in the light path between the spatial light modulator and the image plane, and each pixel controls the image intensity at its corresponding image point.

4. The spatial light modulator of claim 3, wherein a printing surface is disposed proximate to the image plane and is exposed by the filtered radiation.

5. The spatial light modulator of claim 3, wherein a microlens array is disposed proximate to the image plane, the filtered radiation from each pixel is focused by a corresponding microlens element onto a focal point proximate to a printing surface, and the printing surface is scanned relative to the focal points as the pixels are actuated to form a digitally-synthesized, high-resolution exposure image on the printing surface.

\* \* \* \* \*

UNITED STATES PATENT AND TRADEMARK OFFICE
CERTIFICATE OF CORRECTION

PATENT NO. : 6,301,000 B1
DATED : October 9, 2001
INVENTOR(S) : Kenneth Carlisle Johnson It is certified that error appears in the above-identified patent and that said Letters Patent is hereby corrected as shown below:

Column 1,
Line 35, change "Modem" to --Modern --.

Column 4,
Line 28, change "405" to -- 405 --.
Line 67, change "defined an" to -- defined by an --.

Signed and Sealed this

Twenty-second Day of April, 2003

JAMES E. ROGAN
*Director of the United States Patent and Trademark Office*